(12) United States Patent
Mukherjee et al.

(10) Patent No.: US 8,497,708 B2
(45) Date of Patent: Jul. 30, 2013

(54) FRACTIONAL-RATE PHASE FREQUENCY DETECTOR

(75) Inventors: Tonmoy Shankar Mukherjee, Atlanta, GA (US); Arlo James Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 66 days.

(21) Appl. No.: 13/102,932

(22) Filed: May 6, 2011

(65) Prior Publication Data

US 2012/0280716 A1    Nov. 8, 2012

(51) Int. Cl.
*H03D 13/00*    (2006.01)
(52) U.S. Cl.
USPC .................................. 327/9; 327/12
(58) Field of Classification Search
USPC ............... 327/2, 3, 5, 7, 9, 10, 12; 375/375
See application file for complete search history.

(56) References Cited

U.S. PATENT DOCUMENTS

| | | | |
|---|---|---|---|
| 5,712,580 A * | 1/1998 | Baumgartner et al. | 327/12 |
| 6,034,554 A * | 3/2000 | Francis et al. | 327/7 |
| 6,055,286 A | 4/2000 | Wu et al. | |
| 6,072,337 A * | 6/2000 | Dalmia et al. | 327/12 |
| 6,075,388 A * | 6/2000 | Dalmia | 327/12 |
| 6,211,741 B1 * | 4/2001 | Dalmia | 331/11 |
| 6,614,314 B2 * | 9/2003 | d'Haene et al. | 331/1 A |
| 6,804,472 B1 | 10/2004 | Ho | |
| 6,847,789 B2 | 1/2005 | Savoj | |
| 6,956,923 B1 * | 10/2005 | Younis et al. | 375/375 |
| 7,050,524 B2 * | 5/2006 | Takasoh et al. | 375/375 |
| 7,057,418 B1 * | 6/2006 | Fu et al. | 327/3 |
| 7,079,055 B2 | 7/2006 | Padaparambil | |
| 7,103,131 B1 * | 9/2006 | Byran et al. | 375/375 |
| 7,170,964 B2 * | 1/2007 | Kocaman et al. | 375/376 |
| 7,251,573 B2 * | 7/2007 | Sanduleanu et al. | 702/79 |
| 7,286,625 B2 * | 10/2007 | Lee et al. | 375/376 |
| 7,466,785 B2 * | 12/2008 | Sanduleanu et al. | 375/375 |
| 7,482,841 B1 | 1/2009 | Nguyen et al. | |
| 7,580,491 B2 * | 8/2009 | Kim et al. | 375/354 |
| 7,692,501 B2 * | 4/2010 | Hsueh et al. | 331/25 |
| 7,697,652 B2 * | 4/2010 | Jeong et al. | 375/376 |
| 7,720,188 B2 | 5/2010 | Sanduleanu et al. | |
| 7,760,030 B2 * | 7/2010 | Jeong et al. | 331/25 |
| 7,795,926 B2 | 9/2010 | Tseng et al. | |
| 7,957,500 B2 * | 6/2011 | Sanduleanu et al. | 375/374 |
| 8,138,798 B2 * | 3/2012 | Nedovic et al. | 327/3 |
| 8,232,821 B2 * | 7/2012 | Saitoh | 327/156 |
| 8,315,349 B2 * | 11/2012 | Badalone | 375/376 |

(Continued)

OTHER PUBLICATIONS

Savoj, J. et al., "Design of Half-Rate Clock and Data Recovery Circuits for Optical Communication Systems", Proceedings of Design Automation Conference (DAC), 2001, pp. 121-126.

(Continued)

*Primary Examiner* — William Hernandez
(74) *Attorney, Agent, or Firm* — Andrew S. Viger; Wade J. Brady, III; Frederick J. Telecky, Jr.

(57) ABSTRACT

A phase frequency detector detects the difference between the edges of a fractional-rate recovered clock signal and the edges within a serial data bit stream, where the edges within the serial data bit stream correspond with the edges of a full-rate clock signal that was used to clock the serial data bit stream.

17 Claims, 5 Drawing Sheets

U.S. PATENT DOCUMENTS

| | | | |
|---|---|---|---|
| 2001/0031028 A1* | 10/2001 | Vaucher | 375/355 |
| 2006/0029177 A1 | 2/2006 | Cranford, Jr. et al. | |
| 2009/0045848 A1* | 2/2009 | Kiaei et al. | 327/10 |
| 2009/0110136 A1 | 4/2009 | Badalone | |
| 2009/0256629 A1 | 10/2009 | Tseng et al. | |
| 2010/0054760 A1* | 3/2010 | Fukuda | 398/202 |
| 2010/0205488 A1 | 8/2010 | Sanduleanu et al. | |

OTHER PUBLICATIONS

Pottbacker, A. et al., "TP10.3: A 8Gb/s Si Bipolar Phase and Frequency Detector IC for Clock Extraction", IEEE International Solid-State Circuits Conference, 1992, pp. 162-163.

* cited by examiner

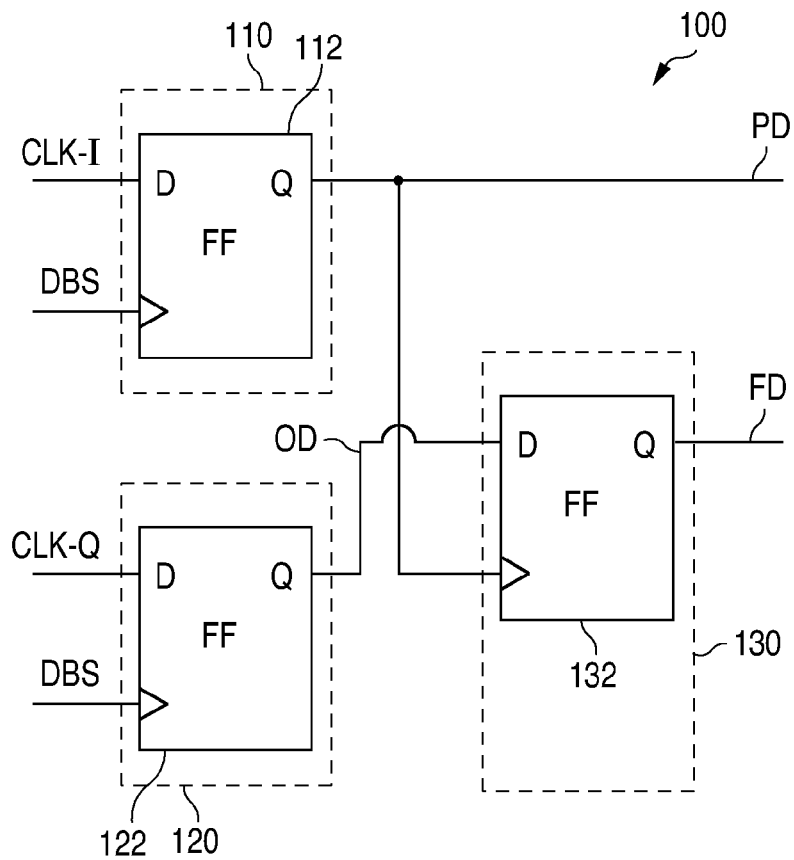
FIG. 1
(PRIOR ART)
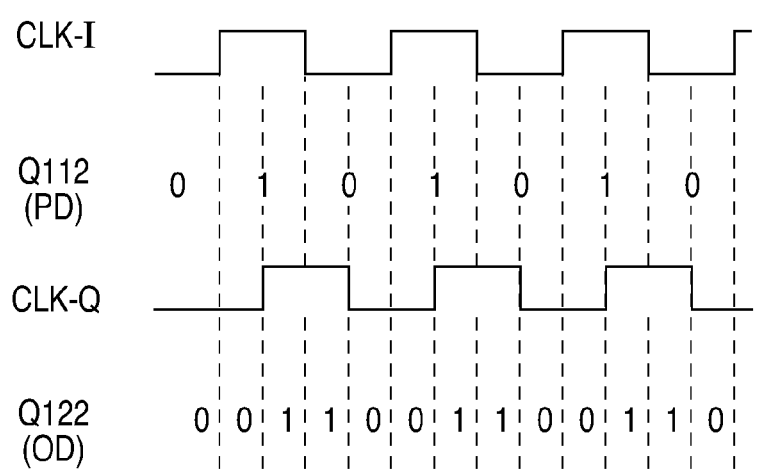
FIG. 2A
(PRIOR ART)
FIG. 2B
(PRIOR ART)
FIG. 3A
(PRIOR ART)
FIG. 3B
(PRIOR ART)

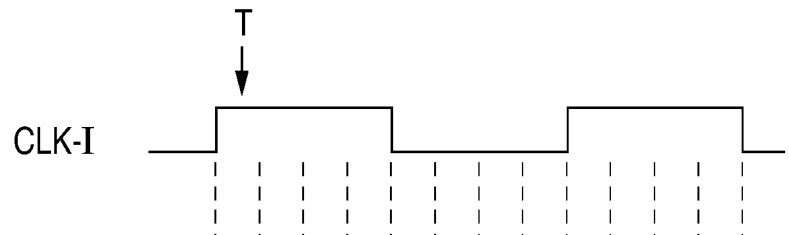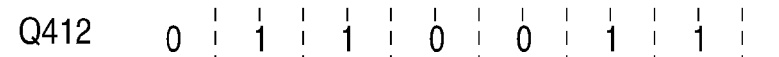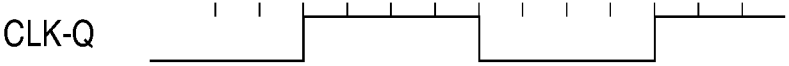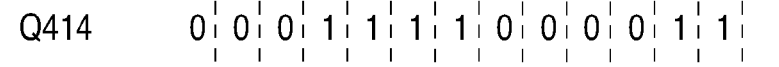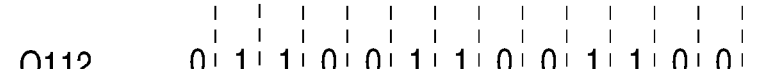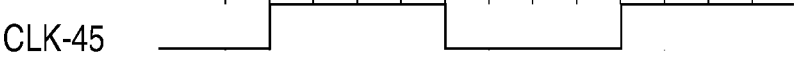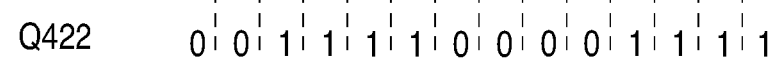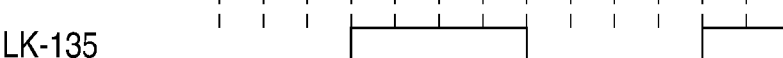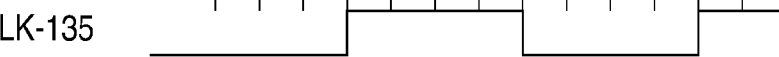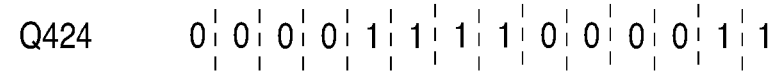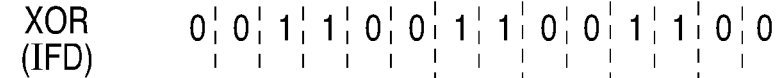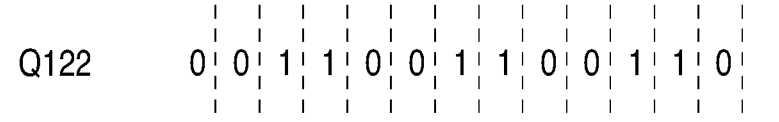

US 8,497,708 B2

FRACTIONAL-RATE PHASE FREQUENCY DETECTOR

BACKGROUND OF THE INVENTION

1. Field of the Invention

The present invention relates to phase frequency detectors and, more particularly, to a fractional-rate phase frequency detector.

2. Description of the Related Art

A serial data receiver is a device that receives a serial data bit stream, and converts the data in the steam into a format which can be processed. To extract the data from the serial data bit stream, a serial data receiver must typically recover the clock signal that was used to clock the serial data bit stream from the serial data bit stream.

To recover the clock signal from a serial data bit stream, serial data receivers commonly utilize a circuit known as a phase-locked-loop (PLL). A conventional PLL includes a voltage-controlled oscillator (VCO), a phase frequency detector that is connected to the VCO, and a loop filter that is connected to the phase frequency detector and the VCO.

In operation, the VCO generates a recovered clock signal that has a phase and frequency which are defined by the value of a VCO control voltage. In addition, the phase frequency detector detects the difference in phase and frequency between the edges of the recovered clock signal and the edges within the serial data bit stream.

The loop filter filters the phase and frequency differences to output the VCO control voltage to the VCO to adjust the phase and frequency of the recovered clock signal until the phase and frequency of the recovered clock signal match the phase and frequency of the clock signal that was used to clock the serial data bit stream.

Thus, when the recovered clock signal locks onto the edges in the serial data bit stream, the recovered clock signal is substantially the same as the clock signal used to clock the serial data bit stream. As a result, the phase and frequency of the recovered clock signal and the phase and frequency of the clock signal used to clock the serial data bit steam are substantially the same.

There are many types of phase frequency detectors known in the art. One type of phase frequency detector is a Pottbacker phase frequency detector. Pottbacker phase frequency detectors are always connected to a VCO circuit that outputs the recovered clock signal as an in-phase clock signal, and also outputs a quadrature clock signal (a clock signal that is identical to the in-phase clock signal, but which lags the in-phase clock signal by 90°).

FIG. 1 shows a diagram that illustrates a prior-art Pottbacker phase frequency detector 100. As shown in FIG. 1, Pottbacker phase frequency detector 100 includes a phase detector 110 that detects a difference in phase between the edges of an in-phase clock signal CLK-I and the edges in a serial data bit steam DBS, which are clocked by a clock signal, and generates a phase difference signal PD that represents the difference in phase.

As further shown in FIG. 1, phase detector 110 is implemented with a conventional D flip flop 112 that has a data input D connected to receive the in-phase clock signal CLK-I, a clock input connected to receive the serial data bit stream DBS, and a Q output that generates the phase difference signal PD. The serial data bit stream DBS can be, for example, in a non-return to zero (NRZ) format.

FIGS. 2A-2B show diagrams that illustrate the operation of phase detector 110. FIG. 2A shows the in-phase clock signal CLK-I, while FIG. 2B shows the Q output Q112 of flip flop 112. As shown in FIGS. 2A-2B, if an edge in the serial data bit stream DBS (which corresponds with an edge of the clock signal used to clock the serial data bit stream DBS) clocks flip flop 112 when the in-phase clock signal CLK-I is low, flip flop 112 outputs the phase difference signal PD with a logic zero. Similarly, if the edge clocks flip flop 112 when the in-phase clock signal CLK-I is high, flip flop 112 outputs the phase difference signal PD with a logic high.

Referring again to FIG. 1, Pottbacker phase frequency detector 100 also includes a phase detector 120 that detects a difference in phase between the edges of an out-of-phase clock signal CLK-Q and the edges in the serial data bit steam DBS, and generates a phase difference signal OD that represents the difference in phase. The out-of-phase clock signal CLK-Q is the same as the in-phase clock signal CLK-I, but lags the in-phase clock signal CLK-I by 90°.

As shown in FIG. 1, phase detector 120 is implemented with a conventional D flip flop 122 that has a data input D connected to receive the out-of-phase clock signal CLK-Q, a clock input connected to receive the serial data bit stream DBS, and a Q output that generates the phase difference signal OD.

FIGS. 3A-3B show diagrams that illustrate the operation of phase detector 120. FIG. 3A shows the out-of-phase clock signal CLK-Q, while FIG. 3B shows the Q output Q122 of flip flop 122. As shown in FIGS. 3A-3B, the logic state output by the Q output Q112 of flip flop 122 depends on when an edge in the serial data bit stream DBS (which corresponds with an edge of the clock signal used to clock the serial data bit stream DBS) clocks flip flop 122.

Referring again to FIG. 1, Pottbacker phase frequency detector 100 further includes a frequency detector 130 that detects a difference in frequency between the in-phase clock signal CLK-I and the clock signal used to clock the serial data bit steam DBS as represented by the edges in the serial data bit stream DBS, and generates a frequency difference signal FD that represents the difference in frequency.

As shown in FIG. 1, frequency detector 130 is implemented with a conventional D flip flop 132 that has a data input D connected to the Q output of flip flop 122 to receive the phase difference signal OD, a clock input connected to the Q output of flip flop 112 to receive the phase difference signal PD, and a Q output that generates the frequency difference signal FD.

One of the drawbacks of Pottbacker phase frequency detector 100 is that as the frequencies of the serial data bit streams reach ever higher rates, it becomes increasingly harder to route the in-phase clock signal CLK-I (i.e., the recovered clock signal) around to each of the devices that are clocked by the in-phase clock signal CLK-I.

For example, when the serial data bit stream DBS was clocked at a frequency of 12.5 GHz, the VCO locks and generates a 12.5 GHz in-phase clock signal CLK-I, which is routed to the other clocked devices. However, when the clock signal used to clock the serial data bit stream reaches a frequency of, for example, 25 GHz, it becomes increasingly difficult to route a 25 GHz in-phase clock signal around to the other clocked elements.

BRIEF DESCRIPTION OF THE DRAWINGS

FIG. 1 is a diagram illustrating a prior-art Pottbacker phase frequency detector 100.

FIGS. 2A-2B are diagrams illustrating the operation of phase detector 110 of detector 100. FIG. 2A shows the in-phase clock signal CLK-I, while FIG. 2B shows the Q output Q112 of flip flop 112.

FIGS. 3A-3B are diagrams illustrating the operation of phase detector 120 of detector 100. FIG. 3A shows the out-of-phase clock signal CLK-Q, while FIG. 3B shows the Q output Q122 of flip flop 122.

FIGS. 5A-5E are diagrams further illustrating the operation of phase detector 410 in accordance with the present invention. FIG. 5A shows the half-rate in-phase clock signal CLK-I, FIG. 5B shows the Q output Q412 of flip flop 412, FIG. 5C shows the half-rate out-of-phase clock signal CLK-Q, FIG. 5D shows the Q output Q414 of flip flop 414, and FIG. 5E shows the output XOR of exclusive-OR gate 416.

FIGS. 6A-6B are diagrams illustrating the operation of phase detector 110 of detector 100. FIG. 6A shows the in-phase clock signal CLK-I, while FIG. 6B shows the Q output Q112 of flip flop 112.

FIGS. 7A-7E are diagrams further illustrating the operation of frequency detector 420 in accordance with the present invention. FIG. 7A shows the half-rate out-of-phase clock signal CLK-45, FIG. 7B shows the Q output Q422 of flip flop 422, FIG. 7C shows the half-rate out-of-phase clock signal CLK-135, FIG. 7D shows the Q output Q424 of flip flop 424, and FIG. 7E shows the output XOR of exclusive-OR gate 426.

FIGS. 8A-8B are diagrams illustrating the operation of frequency detector 120 of detector 100. FIG. 8A shows the quad-phase clock signal CLK-Q, while FIG. 8B shows the Q output Q122 of flip flop 122.

DETAILED DESCRIPTION OF THE INVENTION

Figure 4:
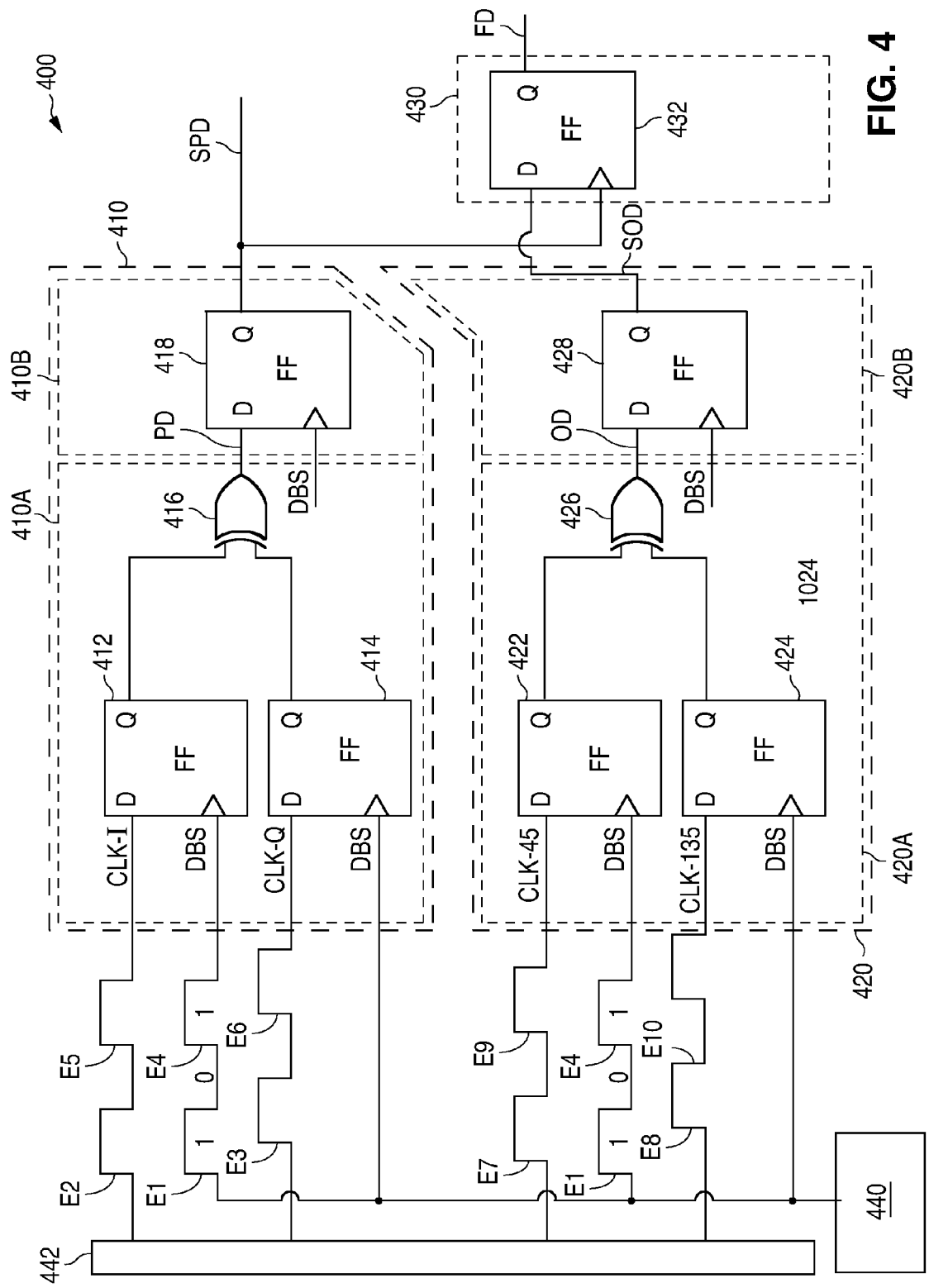
FIG. 4 is a diagram illustrating an example of a half-rate phase frequency detector 400 in accordance with the present invention.

FIG. 4 shows a diagram that illustrates an example of a half-rate phase frequency detector 400 in accordance with the present invention. As described in greater detail below, the present invention synchronizes the edges of a fractional-rate (e.g., half-rate, quarter-rate) recovered clock signal to the edges within a serial data bit stream which were clocked with a full-rate clock signal.

As shown in FIG. 4, phase frequency detector 400 includes a phase detector 410 that determines a phase difference between the edges in a serial data bit stream DBS and the edges of an in-phase clock signal CLK-I, and generates a synchronized phase difference signal SPD that represents the difference in phase between the full-rate clock signal that was used to clock the serial data bit stream DBS and a full-rate version of the in-phase clock signal CLK-I.

The serial data bit stream DBS is clocked with a full-rate clock signal so that each edge within the serial data bit stream DBS has a corresponding edge in the full-rate clock signal. The full-rate clock signal used to clock the serial data bit stream DBS, in turn, has a frequency that is an even integer multiple greater than the frequency of the in-phase clock signal CLK-I.

In the FIG. 4 example, the full-rate clock signal used to clock the serial data bit stream DBS has a frequency of 25 GHz and the in-phase clock signal CLK-I has a frequency of 12.5 GHz. In addition, the serial data bit stream DBS is illustrated with a one-zero-one data pattern in a non-return to zero (NRZ) format.

In the present example, phase detector 410 includes a detector circuit 410A and a synch/clean up circuit 410B. Detector circuit 410A makes the phase difference determinations, and outputs a phase difference signal PD that represents the phase difference determinations. Synch/clean up circuit 410B, in turn, generates the synchronized phase difference signal SPD as a delayed version of the phase difference signal PD.

In the present example, the phase difference signal PD and synchronized phase difference signal SPD each has a first logic state when an edge within the serial data bit stream DBS leads the closest edge of the half-rate in-phase clock signal CLK-I, and a second logic state when the edge within the serial data bit stream DBS lags the closest edge of the half-rate in-phase clock signal CLK-I.

Phase detector 410 detects a difference in phase between the full-rate clock signal that was used to clock the serial data bit stream DBS and the full-rate version of the in-phase clock signal CLK-I by sampling the half-rate in-phase clock signal CLK-I and a half-rate out-of-phase clock signal CLK-Q (a clock signal identical to the in-phase clock signal CLK-I, but which lags the in-phase clock signal CLK-I by 90°) in response to the edges within the serial data bit stream DBS. The sampled values from the half-rate in-phase clock signal CLK-I and the half-rate out-of-phase clock signal CLK-Q are then logically exclusively ORed together to form the phase difference signal PD.

In the FIG. 4 example, phase detector 410 determines a phase difference between a rising bit edge in the serial data bit stream DBS, such as rising edge E1, and a clock edge (rising or falling) of the in-phase clock signal CLK-I that lies closest in time to the bit edge, such as rising edge E2, determines a phase difference between the rising bit edge in the serial data bit stream DBS, such as rising edge E1, and a clock edge (rising or falling) of the out-of-phase clock signal CLK-Q that lies closest in time to the bit edge, such as rising edge E3, and generates the phase difference signal PD in response to the differences in phase.

Phase detector 410 also determines a next phase difference between a next rising bit edge in the serial data bit stream DBS, such as rising edge E4, and a clock edge (rising or falling) of the in-phase clock signal CLK-I which occurs closest in time to the next bit edge, such as rising edge E5, determines a next phase difference between the next rising bit edge in the serial data bit stream DBS, such as rising edge E4, and a clock edge (rising or falling) of the out-of-phase clock signal CLK-Q which occurs closest in time to the next bit edge, such as rising edge E6, and modifies the phase difference signal PD to account for any change in the phase differences.

Although phase detector 410 has been described as responding to the rising bit edges in the serial data bit stream DBS, phase detector 410 can alternately respond to the falling bit edges in the serial data bit stream DBS, or both the rising and falling bit edges in the serial data bit stream DBS.

Further in the FIG. 4 example, detector stage 410A is implemented with a rising-edge triggered D flip flop 412, a rising-edge triggered D flip flop 414, and an exclusive-OR gate 416, while synch/clean up circuit 410B is implemented with a rising-edge triggered D flip flop 418. Each of the flops and gates can be realized with conventional devices.

D flip flop 412 has a data input D connected to receive the half-rate in-phase clock signal CLK-I, a clock input connected to receive the serial data bit stream DBS, and a Q output. D flip flop 414 has a data input D connected to receive the half-rate out-of-phase clock signal CLK-Q, a clock input connected to receive the serial data bit stream DBS, and a Q output.

Exclusive-OR gate 416 has a first input connected to the Q output of flip flop 412, a second input connected to the Q output of flip flop 414, and an output that generates the phase difference signal PD. D flip flop 418 has a data input D connected to the output of exclusive-OR gate 416, a clock input connected to receive the serial data bit stream DBS, and a Q output that generates the synchronized phase difference signal SPD. Although the flip flops 412, 414, and 418 have been described as all being rising-edge triggered flip flops, the flip flops 412, 414, and 418 can alternately all be implemented with falling-edge triggered flip flops as well as all being implemented with doubled-edge triggered flip flops.

In operation, when an edge within the serial data bit stream DBS clocks flip flops 412 and 414, the logic states of the half-rate in-phase clock signal CLK-I and the half-rate out-of-phase clock signal CLK-Q are captured and logically exclusively-ORed to generate the phase difference signal PD. The phase difference signal PD is then output by flip flop 418 as the synchronized phase difference signal SPD on the next clocking edge within the serial data bit stream DBS.

FIGS. 5A-5E show diagrams that further illustrate the operation of phase detector 410 in accordance with the present invention. FIG. 5A shows the half-rate in-phase clock signal CLK-I, FIG. 5B shows the Q output Q412 of flip flop 412, FIG. 5C shows the half-rate out-of-phase clock signal CLK-Q, FIG. 5D shows the Q output Q414 of flip flop 414, and FIG. 5E shows the output XOR of exclusive-OR gate 416.

As shown in FIGS. 5A-5E, the logic state of the XOR output of exclusive-OR gate 416 depends on when an edge in the serial data bit stream DBS clocks flip flops 412 and 414. For example, if a rising edge within the serial data bit stream DBS is detected at time T, then flip flop 412 outputs a logic high, flip flop 414 outputs a logic low, and exclusive-OR gate 416 outputs a logic high.

FIGS. 6A-6B show diagrams that illustrate the operation of phase detector 110 of detector 100. FIG. 6A shows the in-phase clock signal CLK-I, while FIG. 6B shows the Q output Q112 of flip flop 112. As shown in FIGS. 5A and 6A, the frequency of the half-rate in-phase clock signal CLK-I input to phase frequency detector 400 (FIG. 5A) is one-half the frequency of the in-phase clock signal CLK-I input to phase frequency detector 100 (FIG. 6A). Further, as shown in FIGS. 5E, 6A, and 6B, the XOR output of exclusive-OR gate 416 is identical to the output Q112 of flip flop 112.

Thus, the present example of the invention generates a phase difference signal PD and a synchronized phase difference signal SPD that are identical to the phase difference signal PD output by flip flop 112, while at the same time using an in-phase clock signal CLK-I and an out-of-phase clock signal CLK-Q that are both one-half the frequency of the clock signal that was used to clock the serial data bit stream DBS.

As a result, one of the advantages of the present invention is that, for example, a 12.5 GHz recovered clock signal (in-phase clock signal CLK-I) can be locked to a 25 GHz clock signal that was used to clock the serial data bit stream DBS. A 12.5 GHz recovered clock signal, in turn, is much easier to route to other clocked devices than is a 25 GHz signal.

Referring back to FIG. 4, phase frequency detector 400 also includes a phase detector 420 that determines a phase difference between the edges in the serial data bit stream DBS and the edges of an out of-phase clock signal CLK-45, and generates a synchronized phase difference signal SOD that represents the difference in phase between the full-rate clock signal that was used to clock the serial data bit stream DBS and a full-rate version of the out-of-phase clock signal CLK-Q. (The out-of-phase clock signal CLK-45 is identical to the in-phase clock signal CLK-I, but lags the in-phase clock signal CLK-I by 45°.)

In the present example, phase detector 420 includes a detector circuit 420A and a synch/clean up circuit 420B. Detector circuit 420A makes the phase difference determinations, and outputs a phase difference signal OD that represents the phase difference determinations. Synch/clean up circuit 420B, in turn, generates the synchronized phase difference signal SOD as a delayed version of the phase difference signal OD.

Phase detector 420 detects a difference in phase between the full-rate clock signal that was used to clock the serial data bit stream DBS and the full-rate version of the out-of-phase clock signal CLK-Q by sampling a half-rate out-of-phase clock signal CLK-45 and a half-rate out-of-phase clock signal CLK-135 in response to the edges within the serial data bit stream DBS. (The out-of-phase clock signal CLK-135 is identical to the in-phase clock signal CLK-I, but lags the in-phase clock signal CLK-I by 135°.) The sampled values from the half-rate out-of-phase clock signal CLK-45 and the half-rate out-of-phase clock signal CLK-135 are then logically exclusively ORed together to form the phase difference signal OD.

In the FIG. 4 example, phase detector 420 determines a phase difference between a rising bit edge in the serial data bit stream DBS, such as rising edge E1, and a clock edge (rising or falling) of the out-of-phase clock signal CLK-45 that lies closest in time to the bit edge, such as rising edge E7, determines a phase difference between the rising bit edge in the serial data bit stream DBS, such as rising edge E1, and a clock edge (rising or falling) of the out-of-phase clock signal CLK-135 that lies closest in time to the bit edge, such as rising edge E8, and generates the phase difference signal OD that represents the differences in phase.

Phase detector 420 also determines a next phase difference between the next rising bit edge in the serial data bit stream DBS, such as rising edge E4, and a clock edge (rising or falling) of the out-of-phase clock signal CLK-45 which occurs closest in time to the next bit edge, such as rising edge E9, determines a next phase difference between the next rising bit edge in the serial data bit stream DBS, such as rising edge E4, and a clock edge (rising or falling) of the out-of-phase clock signal CLK-135 which occurs closest in time to the next bit edge, such as falling edge E10, and modifies the synchronized phase difference signal SOD to account for any change in the phase differences.

Although phase detector 420 has been described as responding to the rising bit edges in the serial data bit stream DBS, phase detector 420 can alternately respond to the falling bit edges in the serial data bit stream DBS, or both the rising and falling bit edges in the serial data bit stream DBS.

Further in the FIG. 4 example, phase detector 420 is implemented with a rising-edge triggered D flip flop 422, a rising-edge triggered D flip flop 424, and an exclusive-OR gate 426, while synch/clean up circuit 420B is implemented with a rising-edge triggered D flip flop 428. Each of the flops and gates can be realized with conventional devices. D flip flop 422 has a data input D connected to receive the half-rate out-of-phase clock signal CLK-45, a clock input connected to receive the serial data bit stream DBS, and a Q output.

D flip flop 424 has a data input D connected to receive the half-rate out-of-phase clock signal CLK-135, a clock input connected to receive the serial data bit stream DBS, and a Q output. Exclusive-OR gate 426 has a first input connected to the Q output of flip flop 422, a second input connected to the Q output of flip flop 424, and an output that generates the phase difference signal OD.

D flip flop 428 has a data input D connected to the output of exclusive-OR gate 416, a clock input connected to receive the serial data bit stream DBS, and a Q output that generates the synchronized phase difference signal SOD. D flip flop 418 and D flip flop 428 are used to synchronize the phase difference signal PD and the phase difference signal OD to ensure that the phase difference signal PD and the phase difference signal OD are output with the proper timing.

In addition, D flip flop 418 and D flip flop 428 also remove glitches from the exclusive-OR gates 416 and 426, respectively. (Exclusive-OR gates can have output glitches during state changes which are removed by clocking the output through flops.) Thus, flip flops 418 and 428 (synch/clean up circuits 410B and 420B) can be omitted if synchronization and glitch prevention are not required. Further, although all of the flip flops 422, 424, and 428 have been described as being rising-edge triggered flip flops, the flip flops 422, 424, and 428 can alternately all be implemented with falling-edge triggered flip flops as well as all being implemented with doubled-edge triggered flip flops.

In operation, when an edge within the serial data bit stream DBS clocks flip flops 422 and 424, the logic states of the half-rate out-of-phase clock signal CLK-45 and the half-rate out-of-phase clock signal CLK-135 are captured and logically exclusively-ORed to generate the phase difference signal OD. The phase difference signal OD is then output by flip flop 428 as the synchronized phase difference signal SOD on the next clocking edge within the serial data bit stream DBS.

FIGS. 7A-7E show diagrams that further illustrate the operation of phase detector 420. FIG. 7A shows the half-rate out-of-phase clock signal CLK-45, FIG. 7B shows the Q output Q422 of flip flop 422, FIG. 7C shows the half-rate out-of-phase clock signal CLK-135, FIG. 7D shows the Q output Q424 of flip flop 424, and FIG. 7E shows the XOR output of exclusive-OR gate 426.

As shown in FIGS. 7A-7E, the logic state of the XOR output of exclusive-OR gate 426 depends on when an edge in the serial data bit stream DBS clocks flip flops 422 and 424. For example, if a rising edge within the serial data bit stream DBS is detected at time T, then flip flop 422 outputs a logic low, flip flop 424 outputs a logic low, and exclusive-OR gate 426 outputs a logic low.

FIGS. 8A-8B show diagrams that illustrate the operation of frequency detector 120 of detector 100. FIG. 8A shows the quad-phase clock signal CLK-Q, while FIG. 8B shows the Q output Q122 of flip flop 122. As shown in FIGS. 7E, 8A, and 8B, the XOR output of exclusive-OR gate 426 is identical to the output Q122 of flip flop 122.

Thus, the present example of the invention generates a phase difference signal OD and a synchronized phase difference signal SOD that are identical to the phase difference signal OD output by flip flop 122, while at the same time using an out-of-phase clock signal CLK-45 and an out-of-phase clock signal CLK-135 that are both one-half the frequency of the clock signal that was used to clock the serial data bit stream DBS.

Referring again to FIG. 4, phase frequency detector 400 further includes a frequency detector 430 that detects a difference in frequency between the frequency of the full-rate version of in-phase clock signal CLK-I and the frequency of the full-rate clock signal used to clock the serial data bit steam DBS, and generates a frequency difference signal FD that represents the difference in frequency.

As shown in FIG. 4, frequency detector 430 is implemented with a conventional D flip flop 432 that has a data input D connected to the Q output of flip flop 428 to receive the synchronized phase difference signal SOD, a clock input connected to the Q output of flip flop 418 to receive the synchronized phase difference signal SPD, and a Q output that generates the frequency difference signal FD.

In addition, as further illustrated in FIG. 4, the serial data bit stream DBS is generated by a serial data transmitter 440, and the clock signals CLK-I, CLK-Q, CLK-45, and CLK-135 input to phase frequency detector 400 are generated by a VCO 442 in a conventional manner. For example, VCO circuit 442 can generate a clock signal that is 45° out-of-phase with the in-phase clock signal CLK-I by adding a delay path that is half as long as the delay path used to form a conventional out-of-phase clock signal CLK-Q. Similarly, VCO circuit 442 can also generate a clock signal that is 135° out-of-phase with the in-phase clock signal CLK-I by adding a delay path with the necessary length.

In operation, the synchronized phase difference signal SPD and the frequency difference signal FD are indirectly utilized by VCO 442 to adjust the phase and frequency of the half-rate in-phase clock signal CLK-I to lock the half-rate in-phase clock signal CLK-I to the full-rate clock signal that was used to clock the serial data bit stream DBS.

When the half-rate in-phase clock signal CLK-I is locked to the full-rate clock signal that was used to clock the serial data bit stream DBS, the in-phase clock signal CLK-I has a frequency which is substantially one-half the frequency of the clock signal that was used to clock the serial data bit stream DBS. In addition, each rising edge of the half-rate in-phase clock signal CLK-I occurs substantially at the same time that a rising edge of the full-rate clock signal that was used to clock the serial data bit stream DBS occurs.

In the FIG. 4 example, when the half-rate in-phase clock signal CLK-I is locked to the full-rate clock signal that was used to clock the serial data bit stream DBS, the frequency difference signal FD has a logic low and the synchronized phase difference signal SPD switches back and forth between a logic low and a logic high.

As discussed above, the output from flip flop 112 of phase detector 110 and the output from flip flop 418 of phase detector 410 are the same, and the output from flip flop 122 of phase detector 120 and the output from flip flop 428 of phase detector 420 are the same. Therefore, for example, flip flop 112 and flip flop 122 of a 25 GHz Pottbacker circuit can be replaced with flip flops 412, 414, 418, 422, 424, and 428, along with exclusive-OR gates 416 and 426, to obtain a 25 GHz Pottbacker circuit that utilizes a 12.5 GHz recovered clock signal (in-phase clock signal CLK-I).

Figure 9:
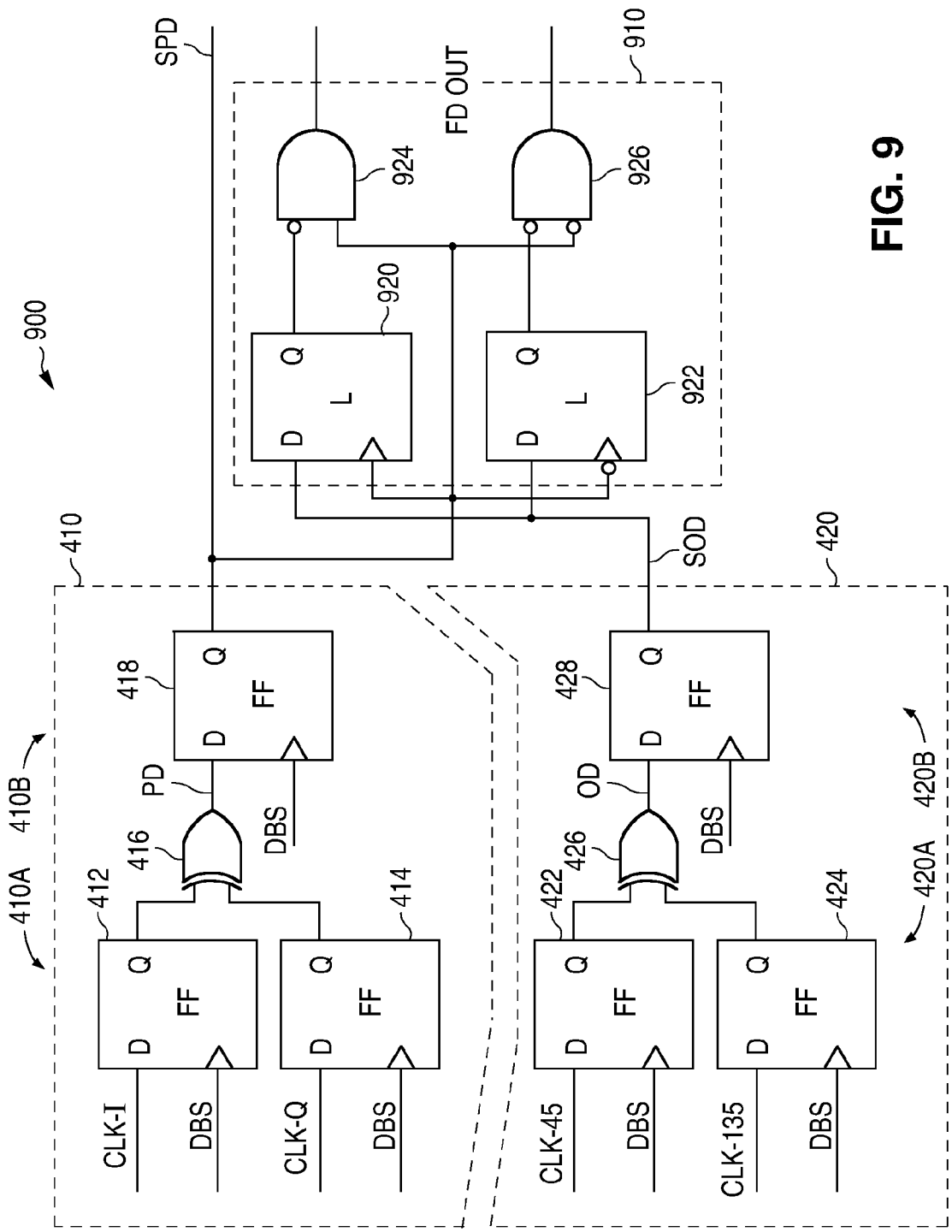
FIG. 9 is a diagram illustrating an example of a half-rate phase frequency detector 900 in accordance with an alternate embodiment of the present invention.

FIG. 9 shows a diagram that illustrates an example of a phase frequency detector 900 in accordance with an alternate embodiment of the present invention. Phase frequency detector 900 is similar to phase frequency detector 400 and, as a result, utilizes the same reference numerals to designate the structures which are common to both detectors.

As shown in FIG. 9, phase frequency detector 900 differs from phase frequent detector 400 in that detector 900 utilizes a frequency detector 910 in lieu of frequency detector 430. Frequency detector 910 includes a latch 920 and a latch 922 that each have a non-inverted data input D which is connected to receive the synchronized phase difference signal SOD. In addition, latch 920 has a non-inverted clock input and latch 922 has an inverted clock input that are both connected to the synchronized phase difference signal SPD.

Output circuit 912 additionally includes a logical AND gate 924 and a logical AND gate 926. Logical AND gate 924 has an inverted input connected to the Q output of latch 920 and a non-inverted input connected to the synchronized phase difference signal SPD. Logical AND gate 926 has an inverted input connected to the Q output of latch 922 and an inverted input connected to the synchronized phase difference signal SPD.

In operation, frequency detector 910 provides an alternate approach to implementing a Pottbacker circuit that provides the signals that are necessary to lock a half-rate recovered clock signal, e.g., a 12.5 GHz clock signal, to the full rate clock signal, e.g., a 25 GHz clock signal, that was used to clock the serial data bit stream DBS.

Thus, the present invention generates a recovered clock signal which has one-half the frequency of the clock signal that was used to clock the serial data bit stream which, in turn, significantly reduces the effort required to construct a clock tree that distributes the recovered clock signal to other clocked devices. In addition, the present invention can also generate a recovered clock signal which has one-quarter (or one-eighth, one-sixteenth, and so on) the frequency of the clock signal that was used to clock the serial data bit stream.

The frequency of the in-phase clock signal and the delayed clock signals that are input to the detector circuits can be reduced by half from a first rate to a second rate, such as from half-rate clock signals to quarter-rate clock signals, or from quarter-rate clock signals to eighth-rate clock signals, by replacing each input flip flop in the detector circuits with an inserted detector circuit, and replacing each first rate clock signal that is received by an input flip flop with a pair of second rate clock signals so that the pair of second rate clock signals are received by the inserted detector circuit that replaced the input flip flop. The pair of second rate clock signals, in turn, are selected so that an exclusive OR of the pair of second rate clock signals generates the first rate clock signal.

Thus, to convert the half-rate phase frequency detector 400 shown in FIG. 4 to a quarter-rate phase frequency detector, flip flops 412, 414, 422, and 424 must each be replaced by an inserted detector circuit. In addition, the first-rate clock signals CLK-I, CLK-Q, CLK-45, and CLK-135 must each be replaced by a pair of second rate clock signals that when exclusively ORed together generates the first rate clock signal.

Figure 10:
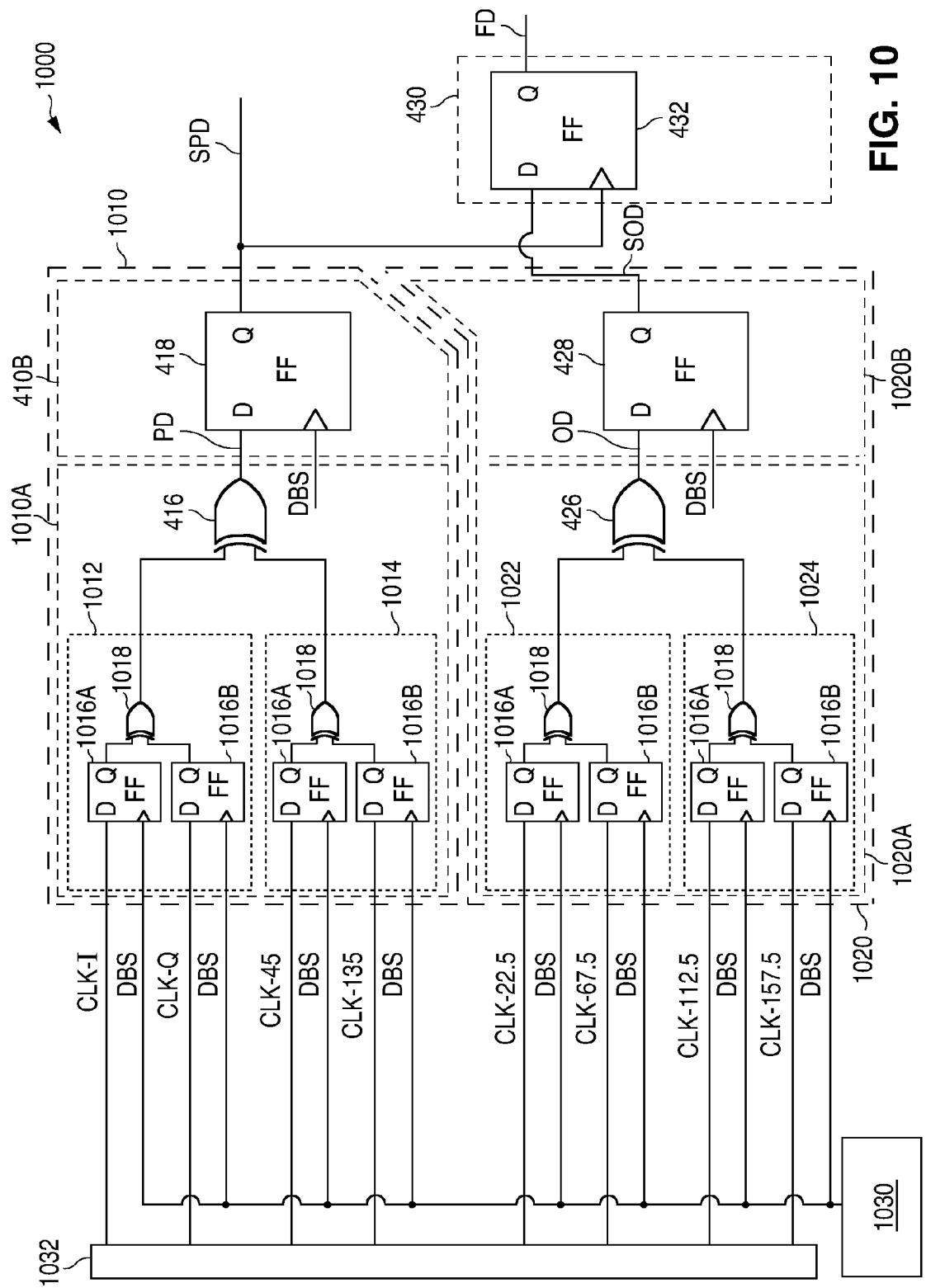
FIG. 10 is a diagram illustrating an example of a quarter-rate phase frequency detector 1000 in accordance with the present invention.

FIG. 10 shows a diagram that illustrates an example of a quarter-rate phase frequency detector 1000 in accordance with the present invention. Phase frequency detector 1000 is similar to phase frequency detector 400 and, as a result, utilizes the same reference numerals to designate the structures which are common to both detectors.

As shown in FIG. 10, phase frequency detector 1000 differs from phase frequent detector 400 in that detector 1000 utilizes a phase detector 1010 in lieu of phase detector 410. Phase detector 1010 is similar to phase detector 410 and, as a result, utilizes the same reference numerals to designate the structures which are common to both detectors.

Phase detector 1010 differs from phase detector 410 in that phase detector 1010 utilizes a detector circuit 1010A in lieu of detector circuit 410A. Detector circuit 1010A is similar to detector circuit 410A and, as a result, utilizes the same reference numerals to designate the structures which are common to both detector circuits.

Detector circuit 1010A differs from detector circuit 410A in that detector circuit 1010A replaced flip flop 412 with a detector circuit 1012, and replaced flip flop 414 with a detector circuit 1014. Detector circuits 1012 and 1014 each has a first rising-edge triggered flip flop 1016A, a second rising-edge triggered flip flop 1016B, and an exclusive OR gate 1018 connected to the outputs of the first and second flip flops 1016A and 1016B. Although the flip flops 1016A and 1016B have both been described as rising-edge triggered flip flops, the flip flops 1016A and 1016B can alternately both be implemented with falling-edge triggered flip flops as well as both being implemented with doubled-edge triggered flip flops.

In addition, the half-rate in-phase clock signal CLK-I that is received by input flip flop 412 is replaced by a quarter-rate in-phase clock signal CLK-I and a quarter-rate out-of-phase clock signal CLK-Q that are received by detector circuit 1012, which replaced flip flop 412. (Quarter-rate clock signal CLK-Q is identical to quarter-rate clock signal CLK-I, but is delayed by 90°.) Logically exclusively ORing the quarter-rate in-phase clock signal CLK-I and the quarter-rate out-of-phase clock signal CLK-Q generates the half-rate in-phase clock signal CLK-I.

For the half-rate delayed clock signal CLK-Q, the pair of quarter-rate clock signals include a quarter-rate clock signal with a first delay and a quarter-rate clock signal with a second delay. The quarter-rate clock signal with the first delay is determined by dividing the delay of the half-rate clock signal by two, while the quarter-rate clock signal with the second delay is determined by adding the first delay of the quarter-rate clock signal to the delay of the half-rate clock signal.

Thus, in the FIG. 10 example, the half-rate (e.g., 12.5 GHz) out-of-phase clock signal CLK-Q that is received by input flip flop 414 is replaced by a quarter-rate (e.g., 6.25 GHz) 45° out-of-phase clock signal CLK-45 and a quarter-rate 135° out-of-phase clock signal CLK-135 that are received by detector circuit 1014, which replaced flip flop 414. (Quarter-rate clock signal CLK-45 and quarter-rate clock signal CLK-135 are identical to quarter-rate clock signal CLK-I, but are delayed by 45° and 135°, respectively.) Logically exclusively ORing the quarter-rate out-of-phase clock signal CLK-45 and the quarter-rate out-of-phase clock signal CLK-135 generates the half-rate out-of-phase clock signal CLK-Q.

The quarter-rate in-phase clock signal CLK-I is received by the data input D of flip-flop 1016A of detector circuit 1012, which replaced flip flop 412, and the quarter-rate out-of-phase clock signal CLK-Q is received by the data input D of flip-flop 1016B of detector circuit 1012, which replaced flip flop 412. The quarter-rate out-of-phase clock signal CLK-45 is received by the data input D of flip-flop 1016A of detector circuit 1014, which replaced flip flop 414, and the quarter-rate out-of-phase clock signal CLK-135 is received by the data input D of flip-flop 1016B of detector circuit 1014, which replaced flip flop 414.

In operation, the quarter-rate in-phase clock signal CLK-I and the quarter-rate out-of-phase clock signals CLK-Q, CLK-45, and CLK-135 have a frequency that is substantially one quarter of the frequency of the full-rate clock signal that was used to clock the serial data bit stream DBS. In addition, the phase difference signal PD output by detector circuit 1010A is identical to the phase difference signal PD output by detector circuit 410A.

As further shown in FIG. 10, phase frequency detector 1000 also differs from phase frequent detector 400 in that detector 1000 utilizes a phase detector 1020 in lieu of phase detector 420. Phase detector 1020 is similar to phase detector 420 and, as a result, utilizes the same reference numerals to designate the structures which are common to both detectors.

Phase detector 1020 differs from phase detector 420 in that phase detector 1020 utilizes a detector circuit 1020A in lieu of detector circuit 420A. Detector circuit 1020A is similar to detector circuit 420A and, as a result, utilizes the same reference numerals to designate the structures which are common to both detector circuits.

Detector circuit 1020A differs from detector circuit 420A in that detector circuit 1020A replaced flip flop 422 with a detector circuit 1022, and replaced flip flop 424 with a detector circuit 1024. Detector circuits 1022 and 1024 each has a first flip flop 1016A, a second flip flop 1016B, and an exclusive OR gate 1018 connected to the outputs of the first and second flip flops 1016A and 1016B.

For the half-rate delayed clock signals CLK-45 and CLK-135, the replacement pair of quarter-rate clock signals include a quarter-rate clock signal with a first delay and a quarter-rate clock signal with a second delay. The quarter-rate clock signal with the first delay is determined by dividing the delay of the half-rate clock signal by two, while the quarter-rate clock signal with the second delay is determined by adding the first delay of the quarter-rate clock signal to the delay of the half-rate clock signal.

Thus, in the FIG. 10 example, the half-rate out-of-phase clock signal CLK-45 that is received by input flip flop 422 is replaced by a quarter-rate 22.5° out-of-phase clock signal CLK-22.5 and a quarter-rate 67.5° out-of-phase clock signal CLK-67.5 that are received by detector circuit 1022, which replaced flip flop 422. (Quarter-rate clock signals CLK-22.5 and CLK-67.5 are identical to quarter-rate clock signal CLK-I, but are delayed by 22.5° and 67.5°, respectively.) Logically exclusively ORing the quarter-rate out-of-phase clock signal CLK-22.5 and the quarter-rate out-of-phase clock signal CLK-67.5 generates the half-rate out-of-phase clock signal CLK-45.

Further, the half-rate out-of-phase clock signal CLK-135 that is received by input flip flop 424 is replaced by a quarter-rate 112.5° out-of-phase clock signal CLK-112.5 and a quarter-rate 157.5° out-of-phase clock signal CLK-157.5 that are received by detector circuit 1024, which replaced flip flop 424. (Quarter-rate clock signals CLK-112.5 and CLK-157.5 are identical to quarter-rate clock signal CLK-I, but are delayed by 112.5° and 157.5°, respectively.) Logically exclusively ORing the quarter-rate out-of-phase clock signal CLK-112.5 and the quarter-rate out-of-phase clock signal CLK-157.5 generates the half-rate out-of-phase clock signal CLK-135.

The quarter-rate out-of-phase clock signal CLK-22.5 is received by the data input D of flip-flop 1016A of detector circuit 1022, which replaced flip flop 422, and the quarter-rate out-of-phase clock signal CLK-67.5 is received by the data input D of flip-flop 1016B of detector circuit 1022, which replaced flip flop 422. The quarter-rate out-of-phase clock signal CLK-112.5 is received by the data input D of flip-flop 1016A of detector circuit 1024, which replaced flip flop 424, and the quarter-rate out-of-phase clock signal CLK-157.5 is received by the data input D of flip-flop 1016B of detector circuit 1024, which replaced flip flop 424.

In operation, the quarter-rate out-of-phase clock signals CLK-22.5, CLK-67.5, CLK-112.5, and CLK-157.5 have a frequency that is substantially one quarter of the frequency of the full-rate clock signal that was used to clock the serial data bit stream DBS. Further, the phase difference signal OD output by detector circuit 1020A is identical to the phase difference signal OD output by detector circuit 420A.

In addition, as further illustrated in FIG. 10, the serial data bit stream DBS is generated by a serial data transmitter 1030, and the clock signals CLK-I, CLK-Q, CLK-45, CLK-135, CLK-22.5, CLK-67.5, CLK-112.5, and CLK-157.5 input to phase frequency detector 1000 are generated by a VCO 1032 in a conventional manner.

For example, VCO circuit 1032 can generate a clock signal that is 45° out-of-phase with the in-phase clock signal CLK-I by adding a delay path that is half as long as the delay path used to form an out-of-phase clock signal CLK-Q. Similarly, VCO circuit 1032 can also generate a clock signal that is 135° out-of-phase with the in-phase clock signal CLK-I by adding a delay path with the necessary length.

In the same manner as above, quarter-rate phase frequency detector 1000 shown in FIG. 10 can be converted to an eighth-rate phase frequency detector. As above, the input flip flops 1016A and 1016B in each detector circuit must each be replaced by an inserted detector circuit. In addition, the clock signals CLK-I, CLK-Q, CLK-45, CLK-135, CLK-22.5, CLK-67.5, CLK-112.5, and CLK-157.5 must each be replaced by a pair of clock signals that when exclusively ORed together again generates the clock signals CLK-I, CLK-Q, CLK-45, CLK-135, CLK-22.5, CLK-67.5, CLK-112.5, and CLK-157.5.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A circuit, comprising:
   phase detector circuitry coupled to receive (a) a serial data bit stream clocked by a full rate clock signal with a full rate frequency, and (b) at least two fractional clock signals with a fractional rate frequency that is a binary integer fraction of the full rate frequency: Clk-I and Clk-Q which lags in phase Clk-I by substantially 90°;
   the phase detector circuitry including:
      sampling circuitry configured to sample the at least Clk-I and Clk-Q fractional clock signals with the serial data bit stream to generate at least first and second phase differences between a sampling bit edge of the serial data bit stream and respective clock edges of the at least Clk-I and Clk-Q fractional clock signals closest in time to the sampling bit edge; and
      phase difference circuitry responsive to the at least first and second phase differences to provide a phase difference signal corresponding to the difference in phase between the edges of the serial data bit stream and at least the Clk-I fractional clock signal, and thereby corresponding to the difference in phase between the full rate clock signal and at least the Clk-I fractional clock signal.

2. The circuit of claim 1 wherein the sampling circuitry includes:
   a first flip flop having a D input, a clock input, and a Q output, the D input to receive the Clk-I fractional clock signal, the clock input to receive the serial data bit stream and the Q output to provide the first phase difference; and
   a second flip flop having a D input, a clock input, and a Q output, the D input of the second flip flop to receive the Clk-Q fractional clock signal, the clock input of the second flip flop to receive the serial data bit stream and the Q output to provide the second phase difference.

3. The circuit of claim 2 wherein the phase difference circuitry includes an exclusive-OR gate having a first input connected to the Q output of the first flip flop, a second input connected to the Q output of the second flip flop, and an output providing the phase difference signal.

4. The circuit of claim 3 further comprising synchronization circuitry including a third flip flop having a D input, a clock input, and a Q output, the D input of the third flip flop being connected to the output of the exclusive-OR gate, the clock input of the third flip flop to receive the serial data bit stream, and the Q output of the third flip flop providing a synchronized phase difference signal.

5. The circuit of claim 1, wherein the fractional rate frequency is one-fourth the full rate frequency, and wherein the phase detector circuitry is coupled to receive four fractional clock signals with the fractional rate frequency of one fourth the full rate frequency: Clk-I, Clk-Q which lags Clk-I by substantially 90°, Clk-45 which lags Clk-I by substantially 45° and Clk-135 which lags Clk-I by substantially 135°;

wherein the sampling circuitry is responsive to the serial data bit stream to sample each of the four fractional clock signals to generate four corresponding phase differences between a sampling bit edge of the serial data bit stream and respective clock edges of the Clk-I, Clk-Q, Clk-45 and Clk135 fractional clock signals closest in time to the sampling bit edge; and wherein the phase difference circuitry is responsive to the four phase differences to provide the phase difference signal.

6. The circuit of claim 5:

wherein the four phase differences are respectively designated a Clk-I phase difference, a Clk-Q phase difference, a Clk-45 phase difference and a Clk-135 phase difference; and wherein the phase difference circuitry includes (a) a first exclusive-or logical operation on the Clk-I and Clk-Q phase differences to provide a first intermediate phase difference signal, (b) a second exclusive-or logical operation on the Clk-45 and Clk-135 phase differences to provide a second intermediate phase difference signal, and (c) a third exclusive-or logical operation on the first and second intermediate phase difference signals to provide the phase difference signal.

7. A circuit, comprising:

first phase detector circuitry coupled to receive (a) a serial data bit stream clocked by a full rate clock signal with a full rate frequency, and (b) two fractional clock signals with a half rate frequency that is one half the full rate frequency: Clk-I and Clk-Q which lags in phase Clk-I by substantially 90°;

the first phase detector circuitry including:

first sampling circuitry configured to sample the Clk-I and Clk-Q fractional clock signals with the serial data bit stream to generate first and second phase differences between a sampling bit edge of the serial data bit stream and respective clock edges of the Clk-I and Clk-Q fractional clock signals closest in time to the sampling bit edge; and first phase difference circuitry responsive to the first and second phase differences to provide a first phase difference signal corresponding to the difference in phase between the edges of the serial data bit stream and at least the Clk-I fractional clock signal, and thereby corresponding to the difference in phase between the full rate clock signal and at least the Clk-I fractional clock signal;

second phase detector circuitry coupled to receive (a) the serial data bit stream clocked by a full rate clock signal with a full rate frequency, and (b) two fractional clock signals both with a frequency corresponding to the fractional rate frequency of the Clk-I fractional clock signal: Clk-45 which lags in phase the Clk-I fractional clock signal by substantially 45°, and Clk-135 which lags the Clk-I fractional clock signal by substantially 135°;

the second phase detector circuitry detector circuitry including:

second sampling circuitry configured to sample the Clk-45 and Clk-135 fractional clock signals with the serial data bit stream to generate third and fourth phase differences between the sampling bit edge of the serial data bit stream and respective clock edges of the Clk-45 and Clk135 fractional clock signals closest in time to the sampling bit edge; and second phase difference circuitry responsive to the third and fourth phase differences to provide a second phase difference signal corresponding to the difference in phase between the edges of the serial data bit stream and at least the Clk-I fractional clock signal; and frequency detector circuitry responsive to the first and second phase difference signals to provide a frequency difference signal corresponding to the difference in frequency between the full rate clock signal used to clock the serial data bit stream and at least the Clk-I fractional clock signal.

8. The circuit of claim 7 wherein:

the first sampling circuitry includes:

a first flip flop having a D input, a clock input, and a Q output, the D input to receive the Clk-I fractional clock signal, the clock input to receive the serial data bit stream and the Q output to provide the first phase difference; and a second flip flop having a D input, a clock input, and a Q output, the D input of the second flip flop to receive the Clk-Q fractional clock signal, the clock input of the second flip flop to receive the serial data bit stream and the Q output to provide the second phase difference; and the second sampling circuitry includes:

a third flip flop having a D input, a clock input, and a Q output, the D input of the third flip flop to receive the Clk-45 fractional clock signal, the clock input to receive the serial data bit stream and the Q output to provide the third phase difference; and a fourth flip flop having a D input, a clock input, and a Q output, the D input of the fourth flip flop to receive the Clk-135 fractional clock signal, the clock input of the fourth flip flop to receive the serial data bit stream and the Q output to provide the fourth phase difference.

9. The circuit of claim 8 wherein:

the first phase difference circuitry includes a first exclusive-OR gate having a first input connected to the Q output of the first flip flop, a second input connected to the Q output of the second flip flop, and an output providing the first phase difference signal; and the second phase difference circuitry includes a second exclusive-OR gate having a first input connected to the Q output of the third flip flop, a second input connected to the Q output of the fourth flip flop, and an output providing the second phase difference signal.

10. The circuit of claim 9 wherein:

the first phase detector circuitry further comprising first synchronization circuitry that includes a fifth flip flop having a D input, a clock input, and a Q output, the D input of the fifth flip flop being connected to the output of the exclusive-OR gate of the first phase detector, the clock input of the fifth flip flop to receive the serial data bit stream, and the Q output of the fifth flip flop providing a first synchronized phase difference signal; and the second phase detector circuitry further comprising second synchronization circuitry that includes a sixth flip flop having a D input, a clock input, and a Q output, the D input of the sixth flip flop being connected to the output of the exclusive-OR gate of the second phase detector, the clock input of the third flip flop to receive the serial data bit stream, and the Q output of the sixth flip flop providing a second synchronized phase difference signal.

11. The circuit of claim 7:
wherein the first phase detector circuitry is coupled to receive four fractional clock signals with a fractional rate frequency of one fourth the full rate frequency: Clk-I, Clk-Q which lags Clk-I by substantially 90°, Clk-45 which lags Clk-I by substantially 45° and Clk-135 which lags Clk-I by substantially 135°;
  wherein the first sampling circuitry is responsive to the serial data bit stream to sample each of the four fractional clock signals received by the first detector circuitry to generate four corresponding phase differences between a sampling bit edge of the serial data bit stream and respective clock edges of the Clk-I, Clk-Q, Clk-45 and Clk135 fractional clock signals closest in time to the sampling bit edge; and
  wherein the phase difference circuitry is responsive to these four phase differences to provide the first phase difference signal; and
wherein the second phase detector circuitry is coupled to receive four fractional clock signals with a fractional rate frequency of one fourth the full rate frequency: Clk-22.5 which lags Clk-I by substantially 22.5°, Clk-67.5 which lags Clk-I by substantially 67.5°, Clk-112.5 which lags Clk-I by substantially 112.5° and Clk-157.5 which lags Clk-I by substantially 157.5°;
  wherein the second sampling circuitry is responsive to the serial data bit stream to sample each of the four fractional clock signals received by the second phase detector to generate four corresponding phase differences between a sampling bit edge of the serial data bit stream and respective clock edges of the Clk-22.5, Clk-67.5, Clk-112.5 and Clk-157.5 fractional clock signals closest in time to the sampling bit edge; and
  wherein the second phase difference circuitry is responsive to these four phase differences to provide the second phase difference signal.

12. The circuit of claim 11:
wherein the four phase differences generated by the first sampling circuitry are respectively designated a Clk-I phase difference, a Clk-Q phase difference, a Clk-45 phase difference and a Clk-135 phase difference;
wherein the four phase differences generated by the second sampling circuitry are respectively designated a Clk-22.5 phase difference, a Clk-67.5 phase difference, a Clk-112.5 phase difference and a Clk-157.5 phase difference;
wherein the first phase difference circuitry is configured to perform (a) a first exclusive-or logical operation on the Clk-I and Clk-Q phase differences to provide a first intermediate phase difference signal, (b) a second exclusive-or logical operation on the Clk-45 and Clk-135 phase differences to provide a second intermediate phase difference signal, and (c) a third exclusive- or logical operation on the first and second intermediate phase difference signals to provide the first phase difference signal; and
wherein the second phase difference circuitry is configured to perform (a) a first exclusive-or logical operation on the Clk-22.5 and Clk-67.5 phase differences to provide a third intermediate phase difference signal, (b) a second exclusive-or logical operation on the Clk-112.5 and Clk-157.5 phase differences to provide a fourth intermediate phase difference signal, and (c) a third exclusive-or logical operation on the third and forth intermediate phase difference signals to provide the second phase difference signal.

13. A method, comprising:
receiving (a) a serial data bit stream clocked by a full rate clock signal with a full rate frequency, and (b) at least two fractional clock signals with a fractional rate frequency that is a binary integer fraction of the full rate frequency: Clk-I and Clk-Q which lags in phase Clk-I by substantially 90°;
sampling the at least Clk-I and Clk-Q fractional clock signals with the serial data bit stream to determine at least first and second phase differences between a sampling bit edge of the serial data bit stream and respective clock edges of the at least Clk-I and Clk-Q fractional clock signals closest in time to the sampling bit edge; and
providing, in response to the at least first and second phase differences, a phase difference signal corresponding to the difference in phase between the edges of the serial data bit stream and at least the Clk-I fractional clock signal, and thereby corresponding to the difference in phase between the full rate clock signal and at least the Clk-I fractional clock signal.

14. The method of claim 13, wherein providing the phase difference signal is accomplished by performing an exclusive-or logical operation on the at least first and second phase differences.

15. The method of claim 13:
wherein receiving the serial bit stream and fractional clock signals comprises receiving (a) a serial data bit stream clocked by a full rate clock signal with a full rate frequency, and (b) four fractional clock signals with a fractional rate frequency of one fourth the full rate frequency: Clk-I, Clk-Q which lags Clk-I by substantially 90°, Clk-45 which lags Clk-I by substantially 45° and Clk-135 which lags Clk-I by substantially 135°;
wherein sampling the fractional clock signals comprises sampling, in response to the serial data bit stream, each of the four fractional clock signals to determine four corresponding phase differences between the sampling bit edge of the serial data bit stream and respective clock edges of the Clk-I, Clk-Q, Clk-45 and Clk135 fractional clock signals closest in time to the sampling bit edge; and
wherein providing the phase difference signal comprises providing, in response to the four phase differences, a phase difference signal corresponding to the difference in phase between the edges of the serial data bit stream and at least the Clk-I fractional clock signal.

16. The method of claim 15, wherein providing the phase difference signal is accomplished by performing (a) a first exclusive-or logical operation on the Clk-I and Clk-Q phase differences to provide a first intermediate phase difference signal, (b) a second exclusive-or logical operation on the Clk-45 and Clk-135 phase differences to provide a second intermediate phase difference signal, and (c) a third exclusive-or logical operation on the first and second intermediate phase difference signals to provide the phase difference signal.

17. The method of claim 13:
wherein receiving a serial bit stream and fractional clock signals comprises receiving (a) a serial data bit stream clocked by a full rate clock signal with a full rate frequency, and (b) four fractional clock signals with a fractional rate frequency of one fourth the full rate frequency: Clk-I, Clk-Q which lags Clk-I by substantially 90°, Clk-45 which lags Clk-I by substantially 45° and Clk-135 which lags Clk-I by substantially 135°;

wherein sampling the fractional clock signals comprises sampling, in response to the serial data bit stream, each of the four fractional clock signals to determine four corresponding phase differences between the sampling bit edge of the serial data bit stream and respective clock edges of the Clk-I, Clk-Q, Clk-45 and Clk135 fractional clock signals closest in time to the sampling bit edge, the four phase differences being respectively designated a Clk-I phase difference, a Clk-Q phase difference, a Clk-45 phase difference and a Clk-135 phase difference; and wherein providing a phase difference signal comprises:
  providing, in response to the Clk-I and Clk-Q phase differences, a first phase difference signal corresponding to the difference in phase between the edges of the serial data bit stream and at least the Clk-I fractional clock signal;
  providing, in response to the Clk-45 and Clk-135 phase differences, a second phase difference signal corresponding to the difference in phase between the edges of the serial data bit stream and at least the Clk-I fractional clock signal; and further comprising providing, in response to the first and second phase difference signals, a frequency difference signal corresponding to the difference in frequency between the full rate clock signal used to clock the serial data bit stream and at least the Clk-I fractional clock signal.

\* \* \* \* \*